United States Patent
Kim et al.

(10) Patent No.: US 10,825,876 B2
(45) Date of Patent: Nov. 3, 2020

(54) DISPLAY DEVICE AND METHOD OF MANUFACTURING THE SAME

(71) Applicant: SAMSUNG DISPLAY CO., LTD., Yongin-si (KR)

(72) Inventors: Young Dae Kim, Seoul (KR); Jin Seock Kim, Seongnam-si (KR); Kitae Kim, Osan-si (KR); Jonghee Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/553,257

(22) Filed: Aug. 28, 2019

(65) Prior Publication Data
US 2020/0135819 A1 Apr. 30, 2020

(30) Foreign Application Priority Data
Oct. 24, 2018 (KR) .......................... 10-2018-0127504

(51) Int. Cl.
| | |
|---|---|
| *H01L 27/32* | (2006.01) |
| *H01L 51/00* | (2006.01) |
| *H01L 51/50* | (2006.01) |
| *H01L 51/52* | (2006.01) |
| *H01L 51/56* | (2006.01) |

(52) U.S. Cl.
CPC ...... *H01L 27/3246* (2013.01); *H01L 27/3209* (2013.01); *H01L 51/0017* (2013.01); *H01L 51/504* (2013.01); *H01L 51/5206* (2013.01); *H01L 51/5221* (2013.01); *H01L 51/56* (2013.01); *H01L 2251/308* (2013.01)

(58) Field of Classification Search
CPC . H01L 27/3246; H01L 51/56; H01L 27/3209; H01L 51/5206; H01L 51/5221; H01L 51/504; H01L 51/0017; H01L 2251/308
See application file for complete search history.

(56) References Cited

U.S. PATENT DOCUMENTS 8,378,353 B2 * 2/2013 Lee ........................ H01L 27/124
257/59
9,548,321 B2 1/2017 Lee et al.
(Continued)

FOREIGN PATENT DOCUMENTS

| KR | 10-0778442 | 11/2007 |
|---|---|---|
| KR | 10-2012-0032904 | 4/2012 |
| KR | 10-2013-0009137 | 1/2013 |

(Continued)

*Primary Examiner* — Karen Kusumakar
(74) *Attorney, Agent, or Firm* — F. Chau & Associates, LLC

(57) ABSTRACT

A display device includes an insulating layer disposed on a substrate, a pixel electrode including a first conductive layer, a second conductive layer, and a third conductive layer sequentially stacked on the insulating layer, a pixel defining layer covering the pixel electrode and partially exposing the pixel electrode through an opening, an organic light emitting layer disposed in the opening of the pixel defining layer, and an opposing electrode disposed on the organic light emitting layer and overlapping the pixel electrode. A length of the first conductive layer is less than a length of the second conductive layer.

20 Claims, 12 Drawing Sheets

(56) References Cited

U.S. PATENT DOCUMENTS

| | | | | |
|---|---|---|---|---|
| 9,899,623 B2 * | 2/2018 | Kaida | ................ | H01L 51/5206 |
| 2011/0291119 A1 * | 12/2011 | Ryu | .................. | H01L 27/3276 257/88 |

FOREIGN PATENT DOCUMENTS

| KR | 10-2016-0084546 | 7/2016 |
|---|---|---|
| KR | 10-2017-0031023 | 3/2017 |
| KR | 10-1764743 | 7/2017 |

* cited by examiner

<EXEMPLARY EMBODIMENT>

<COMPARATIVE EXAMPLE 1>

<EXEMPLARY EMBODIMENT>

<COMPARATIVE EXAMPLE 1>

DISPLAY DEVICE AND METHOD OF MANUFACTURING THE SAME

CROSS-REFERENCE TO RELATED APPLICATIONS

This application claims priority under 35 U.S.C. § 119 to Korean Patent Application No. 10-2018-0127504 filed on Oct. 24, 2018, the disclosure of which is incorporated by reference herein in its entirety.

TECHNICAL FIELD

Exemplary embodiments of the inventive concept relate to a display device and a method of manufacturing the display device. More particularly, exemplary embodiments of the inventive concept relate to a display device capable of improving particle defects and a method of manufacturing the display device.

DISCUSSION OF THE RELATED ART

Recently, the importance of flat panel display devices having excellent characteristics such as being thin and light weight, and having low power consumption, has been increasing. Among flat panel display devices, liquid crystal display devices and organic light emitting display devices are widely commercialized because they have excellent resolution and image quality. In particular, organic light emitting display devices are becoming more widely used due to their high response speed, low power consumption, and self-luminescence capability.

An organic light emitting display device may include an organic light emitting device formed in a display area and metal lines formed in a peripheral area neighboring the display area. The organic light emitting device may include electrodes and an organic light emitting layer disposed between the electrodes that emits light.

When a metal layer is formed in the display area and the peripheral area and an electrode of the organic light emitting diode is formed by etching the metal layer, a metal line and the metal layer may react with the etchant to cause galvanic corrosion. Galvanic corrosion is a phenomenon in which electrons move and the metal ions are reduced by an oxidation-reduction reaction when two metals having different corrosion potentials are connected to an electrolyte. Galvanic corrosion may occur when the corrosion potential of the metal constituting the metal layer and the metal line differ greatly.

SUMMARY

Exemplary embodiments of the inventive concept provide a display device capable of reducing particle defects.

Exemplary embodiments of the inventive concept provide a method of manufacturing the display device.

According to an exemplary embodiment of the inventive concept, a display device includes an insulating layer disposed on a substrate, a pixel electrode including a first conductive layer, a second conductive layer, and a third conductive layer sequentially stacked on the insulating layer, in which a length of the first conductive layer is less than a length of the second conductive layer, a pixel defining layer covering the pixel electrode and partially exposing the pixel electrode through an opening, an organic light emitting layer disposed in the opening of the pixel defining layer, and an opposing electrode disposed on the organic light emitting layer and overlapping the pixel electrode.

In an exemplary embodiment, the first conductive layer includes indium tin oxide (ITO), the second conductive layer includes silver (Ag), and the third conductive layer includes indium tin oxide (ITO).

In an exemplary embodiment, the display device includes a pad electrode disposed on the substrate in a non-display area that surrounds a display area. The pad electrode includes aluminum (Al).

In an exemplary embodiment, the pad electrode includes a first layer, a second layer and a third layer which are sequentially stacked. The first layer and the third layer include titanium (Ti) and the second layer includes aluminum (Al).

In an exemplary embodiment, the display devices further includes a thin film transistor disposed between the substrate and the pixel electrode. The thin film transistor includes a semiconductor layer, a gate electrode, a source electrode, and a drain electrode.

In an exemplary embodiment, a length difference between the first conductive layer and the second conductive layer in an edge portion of the pixel electrode is about 190 nm to about 250 nm.

According to an exemplary embodiment of the inventive concept, a method of manufacturing a display device includes forming an insulating layer in a display area of a substrate, forming a pixel electrode including a first conductive layer, a second conductive layer, and a third conductive layer sequentially stacked on the insulating layer, patterning the third conductive layer of the pixel electrode by etching the third conductive layer with a first etchant, patterning the second conductive layer and the first conductive layer of the pixel electrode by etching the second conductive layer and the first conductive layer with a second etchant, forming an organic light emitting layer on the pixel electrode, and forming an opposing electrode overlapping the pixel electrode on the organic light emitting layer.

In an exemplary embodiment, the method further includes forming a pad electrode in a non-display area of the substrate. The non-display area surrounds the display area, and the pad electrode includes aluminum (Al).

In an exemplary embodiment, the pad electrode includes a first layer, a second layer and a third layer which are sequentially stacked, the first layer and the third layer include titanium (Ti), and the second layer includes aluminum (Al).

In an exemplary embodiment, forming the pixel electrode includes forming the pixel electrode on the pad electrode disposed in the non-display area.

In an exemplary embodiment, the first conductive layer includes indium tin oxide (ITO), the second conductive layer includes silver (Ag) and the third conductive layer includes indium tin oxide (ITO).

In an exemplary embodiment, in the etching of the third conductive layer, a length of the first conductive layer in an edge portion of the pixel electrode and in an edge portion of the pad electrode is smaller than a length of the second conductive layer, respectively.

In an exemplary embodiment, in the etching of the third conductive layer, an undercut is formed in the first conductive layer in an area corresponding to an edge portion of the pixel electrode and in an area corresponding to an edge portion of the pad electrode.

In an exemplary embodiment, in the etching of the second conductive layer and the first conductive layer, a silver ion generated from the second conductive layer is collected in the undercut.

In an exemplary embodiment, a length of the undercut formed in the edge portion of the pixel electrode is about 190 nm to about 250 nm.

In an exemplary embodiment, a length of the undercut formed in the edge portion of the pad electrode is about 180 nm to about 200 nm.

In an exemplary embodiment, the method further includes forming a pixel defining layer. The pixel defining layer covers the undercut of the pixel electrode and has an opening partially exposing the pixel electrode. The method further includes forming the organic light emitting layer in the opening of the pixel defining layer.

In an exemplary embodiment, the method further includes forming a thin film transistor between the substrate and the pixel electrode. The thin film transistor includes a semiconductor layer, a gate electrode, a source electrode, and a drain electrode.

According to an exemplary embodiment of the inventive concept, a display device includes an insulating layer disposed in a display area of a substrate, a pixel electrode including a first conductive layer, a second conductive layer, and a third conductive layer sequentially stacked on the insulating layer. An undercut is formed in an edge portion of the first conductive layer. The display device further includes a pixel defining layer covering the undercut of the pixel electrode and having an opening partially exposing the pixel electrode, an organic light emitting layer disposed in the opening of the pixel defining layer, and an opposing electrode disposed on the organic light emitting layer and overlapping the pixel electrode.

In an exemplary embodiment, the first conductive layer includes indium tin oxide (ITO), the second conductive layer includes silver (Ag), and the third conductive layer includes indium tin oxide (ITO).

According to exemplary embodiments of the inventive concept, a pixel electrode layer having a stacked structure of ITO/Ag/ITO is patterned by first patterning the upper ITO layer with a first etching process and then patterning the Ag layer and the lower ITO layer with a second etching process. The amount of silver particles may be reduced through the two-step etching process. Therefore, defects that may occur in the manufacturing process caused by the silver particles may be prevented or reduced. In addition, the side surface of a pad electrode may be prevented from being corroded by blocking the reaction with aluminum (Al) included in the pad electrode.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Figure 1:
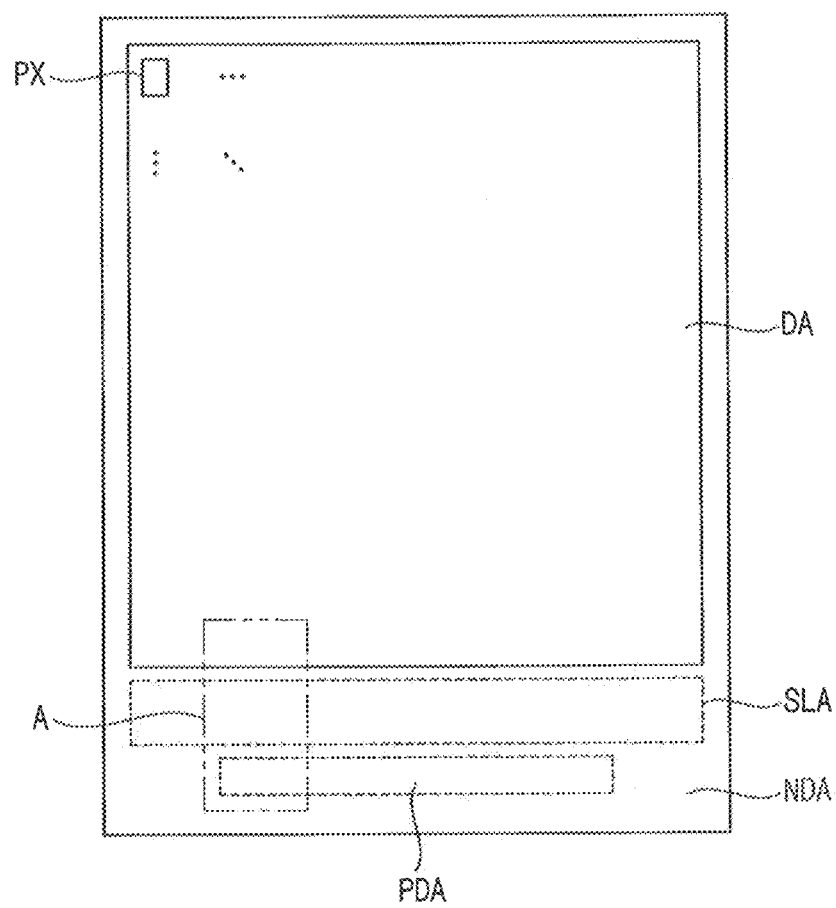
FIG. 1 is a plan view illustrating an organic light emitting display device according to an exemplary embodiment.

Exemplary embodiments of the inventive concept will be described more fully hereinafter with reference to the accompanying drawings. Like reference numerals may refer to like elements throughout the accompanying drawings.

FIG. 1 is a plan view illustrating a display device according to an exemplary embodiment.

Referring to FIG. 1, according to an exemplary embodiment, the display device may include a display area DA and non-display area NDA. The non-display area NDA may surround the display area DA. A plurality of pixels PX may be disposed in the display area DA. In the display area DA, images may be displayed based on light emitted by the plurality of pixels PX.

The non-display area NDA may include a line area SLA in which a plurality of fan-out lines is arranged and a pad area PDA in which a plurality of pad electrodes formed at end portions of the plurality of fan-out lines is arranged.

Figure 2:
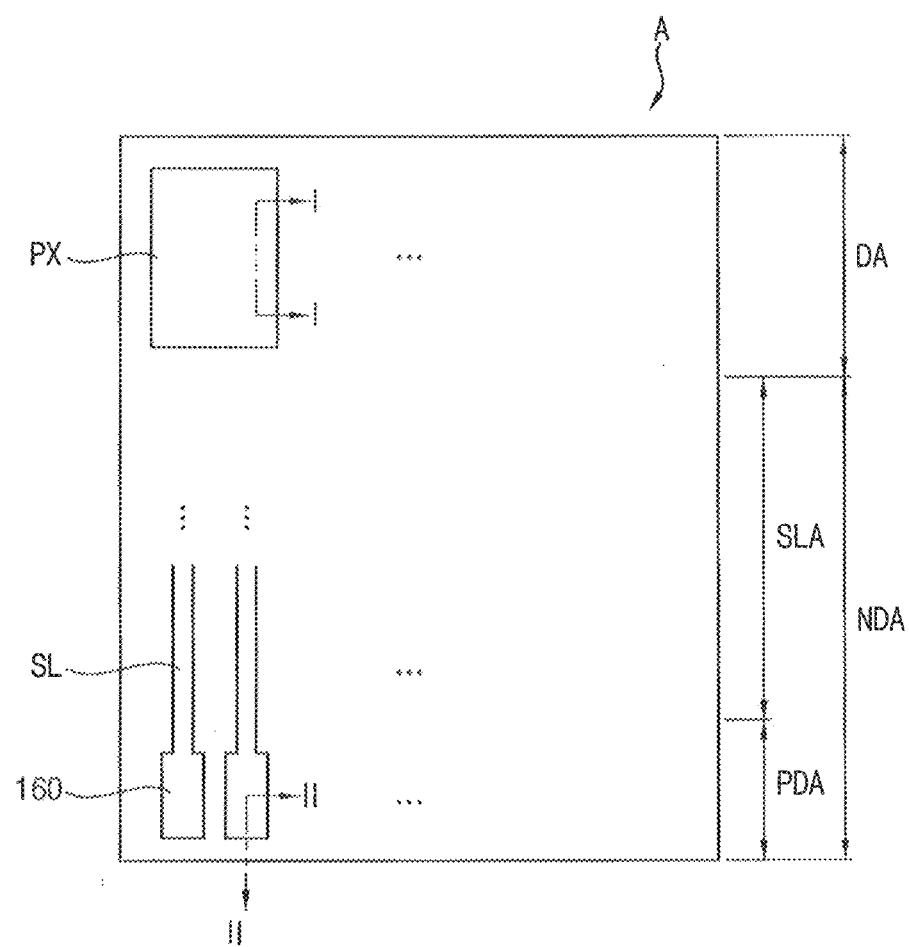
FIG. 2 is an enlarged view illustrating part A of the display device of FIG. 1.
Figure 3:
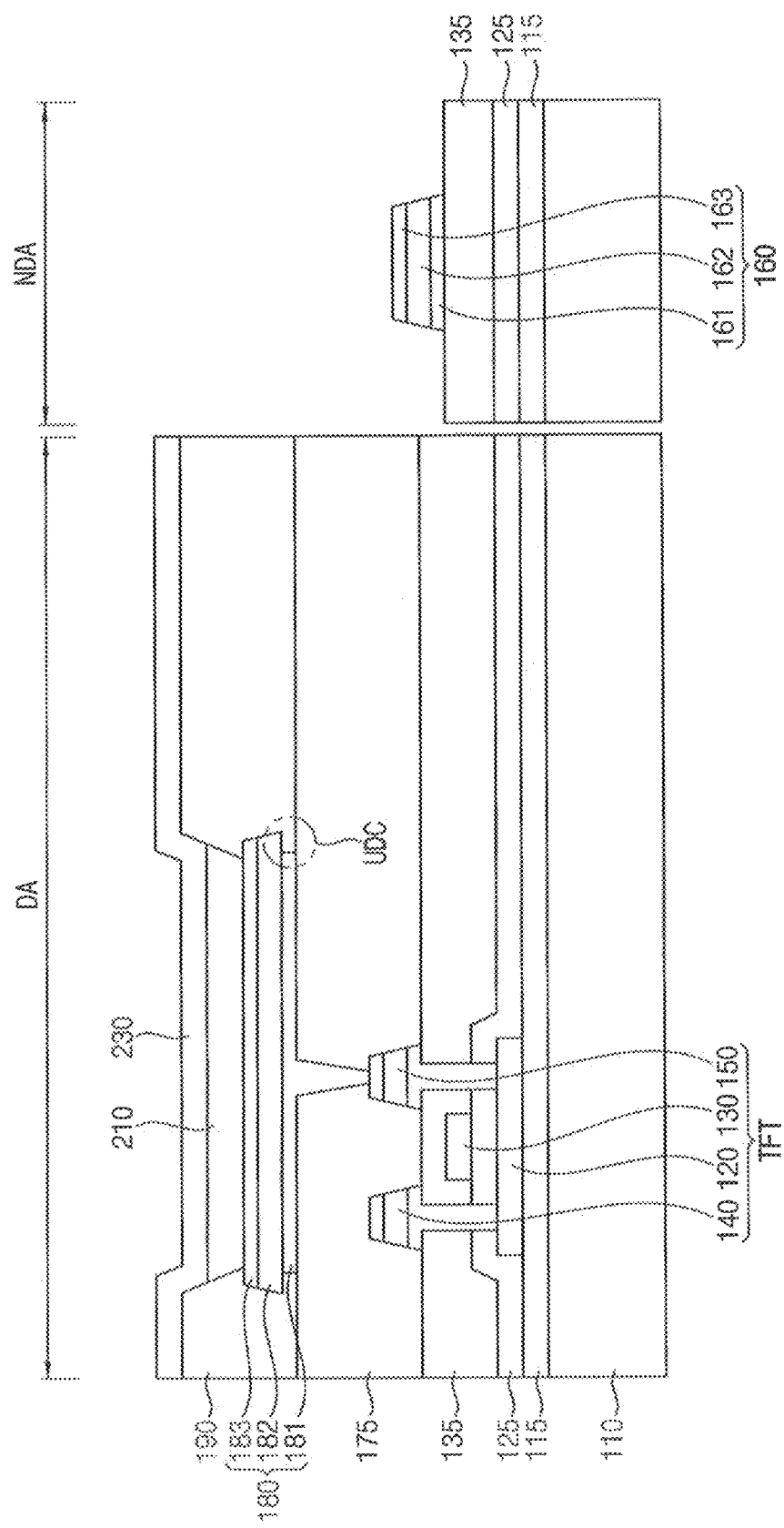
FIG. 3 is a cross-sectional view of a display device taken along line I-I' and line II-II' of FIG. 2.

FIG. 2 is an enlarged view illustrating part A of the display device of FIG. 1. FIG. 3 is a cross-sectional view of a display device taken along line I-I' and line II-II' of FIG. 2.

Referring to FIGS. 2 and 3, according to an exemplary embodiment, the display device may include a substrate 110, a thin film transistor TFT, an organic light emitting diode OLED, a fan-out line SL and a pad electrode 160.

The substrate 110 includes the display area DA and the non-display area NDA. The substrate 110 may be a transparent substrate or an opaque insulating substrate. For example, the substrate 110 may include glass or plastic such as polyimide (PI), polycarbonate (PC), polyethersulfone (PES), polyethylene terephthalate (PET), polyacrylate, and the like.

A buffer layer 115 may be disposed on the substrate 110. The buffer layer 115 may block impurities such as oxygen, water, etc. penetrating through the substrate 110. In addition, the buffer layer 115 may provide a flat surface on top of the substrate 110. The buffer layer 115 may include, for example, silicon nitride, silicon oxide, silicon oxynitride, and the like. Alternatively, the buffer layer 115 may be omitted.

A thin film transistor TFT and an organic light emitting diode OLED may be disposed on the buffer layer 115 in the display area DA. The thin film transistor TFT may include a semiconductor layer 120, a gate electrode 130, a source electrode 140, and a drain electrode 150. In an exemplary embodiment, the thin film transistor TFT may have a top-gate structure in which the gate electrode 130 is disposed on top of the semiconductor layer 120. Alternatively, the thin film transistor TFT may have a bottom-gate structure in which the gate electrode is disposed under the semiconductor layer. Alternatively, the gate electrode may have a double-gate gate structure disposed at the top and bottom of the semiconductor layer 120, respectively.

The semiconductor layer 120 may be disposed on the buffer layer 115. The semiconductor layer 120 may be formed of, for example, amorphous silicon, polycrystalline silicon, an oxide semiconductor, or the like. The semiconductor layer 120 may include a source area, a drain area, and a channel area formed therebetween.

A gate insulating layer 125 covering the semiconductor layer 120 may be disposed on the buffer layer 115. The gate insulating layer 125 may be disposed on the substrate 110 in the display area DA and the non-display area NDA. The gate insulating layer 125 may insulate the gate electrode 130 from the semiconductor layer 120. The gate insulating layer 125 may include, for example, silicon nitride, silicon oxide, silicon oxynitride, and the like.

The gate electrode 130 may be disposed on the gate insulating layer 125. The gate electrode 130 may overlap the channel area of the semiconductor layer 120. The gate electrode 130 may be formed of a first metal layer. The first metal layer may include a metal such as, for example, molybdenum (Mo), aluminum (Al), copper (Cu), or an alloy of metals.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

An interlayer insulating layer 135 covering the gate electrode 130 may be disposed on the gate insulating layer 125. The interlayer insulating layer 135 may be disposed on the substrate 110 in the display area DA and the non-display area NDA. The interlayer insulating layer 135 may insulate the source and drain electrodes 140 and 150 from the gate electrode 130. The interlayer insulating layer 135 may include, for example, silicon nitride, silicon oxide, silicon oxynitride, or the like.

The source electrode 140 and the drain electrode 150 may be disposed on the interlayer insulating layer 135. The source electrode 140 and the drain electrode 150 may be connected to the source area and the drain area of the semiconductor layer 120 through contact holes formed in the interlayer insulating layer 135 and the gate insulating layer 125, respectively. The source electrode 140 and the drain electrode 150 may be formed of a second metal layer. In an exemplary embodiment, the second metal layer may include, for example, aluminum (Al). In an exemplary embodiment, the second metal layer may include, for example, aluminum and an aluminum alloy. The aluminum alloy may include, for example, any one of copper (Cu), vanadium (V) and silicon (Si).

The second metal layer may include a first layer 161, a second layer 162 and a third layer 163 which are sequentially stacked. For example, the first layer 161 may be disposed under the second layer 162, and the third layer 163 may be disposed above the second layer 162. The first layer 161, the second layer 162, and the third layer 163 may include, for example, titanium (Ti), aluminum (Al) and titanium (Ti), respectively.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

The display device may further include a storage capacitor disposed in the display area DA on the substrate 110. The storage capacitor may include a first storage electrode formed of a same first metal layer as the gate electrode 130 and a second storage electrode formed of a same second metal layer as the source and drain electrodes 140 and 150.

A planarization layer 175 may be disposed on the substrate 110. The planarization layer 175 may be an insulating layer for planarizing the display area DA in which the thin film transistor TFT is formed. The planarization layer 175 may include organic materials such as, for example, an acrylic resin, an epoxy resin, a polyimide resin, and a polyester resin.

The organic light emitting diode OLED may be disposed on the planarization layer 175. The organic light emitting diode OLED includes a pixel electrode 180, an organic light emitting layer 210, and an opposing electrode 230. The thin film transistor TFT may be disposed between the substrate 110 and the pixel electrode 180.

The pixel electrode 180 may include a first electrode 181, a second electrode 182, and a third electrode 183, which are sequentially stacked conductive layers. Thus, the first electrode 181 may also be referred to herein as a first conductive layer, the second electrode 182 may also be referred to herein as a second conductive layer, and the third electrode 183 may also be referred to herein as a third conductive layer.

For example, the first electrode 181 is disposed on the planarization layer 175, the second electrode 182 is disposed on the first electrode 181, and the third electrode 183 is disposed on the second electrode 182.

As shown in FIG. 3, in an exemplary embodiment, as a result of an undercut UDC that is formed during the manufacturing of the display device, which will be described in further detail below, a length of the first electrode 181 (the first conductive layer) is less than a length of the second electrode 182 (the second conductive layer).

The first electrode 181 may include indium tin oxide (ITO), the second electrode 182 may include silver (Ag), and the third electrode 183 may include indium tin oxide (ITO). The second electrode 182 of the pixel electrode 180 may serve as a main conductive layer. The first electrode 181 and the third electrode 183 of the pixel electrode 180 may serve as an auxiliary conductive layer for protecting a lower surface and an upper surface of the second electrode 182, respectively.

A pixel defining layer 190 having an opening exposing the pixel electrode 180 may be disposed in the display area DA of the substrate 110 on which the pixel electrode 180 is disposed. The pixel defining layer 190 may include an opening exposing an upper surface of the pixel electrode 180, and a light emitting area of the pixel may be defined as an area in which the opening is formed. The pixel defining layer 190 may include organic materials such as, for example, an acrylic resin, an epoxy resin, a polyimide resin, and a polyester resin.

The organic light emitting layer 210 may be disposed within the opening of the pixel defining layer 190. The organic light emitting layer 210 may include a low molecular weight organic compound or a high molecular weight organic compound.

In an exemplary embodiment, the organic light emitting layer 210 may emit a red light, a green light, or a blue light. In an exemplary embodiment, when the organic light emitting layer 210 emits a white light, the organic light emitting layer 210 may include a multilayer structure including a red light emitting layer, a green light emitting layer, and a blue light emitting layer, or may include a single layer structure including a red light emitting material, a green light emitting material, and a blue light emitting material.

The opposing electrode 230 may be disposed on the organic light emitting layer 210 in the display area DA. For example, the opposing electrode 230 may be disposed on the organic light emitting layer 210 and the pixel defining layer 190. The opposing electrode 230 may include, for example, lithium (Li), calcium (Ca), lithium fluoride (LiF), aluminum (Al), magnesium (Mg), or combinations thereof. For example, the opposing electrode 230 may have an Mg/Ag structure in which magnesium (Mg) and silver (Ag) are stacked. The opposing electrode 230 may overlap the pixel electrode 180.

The pad electrode 160 formed at an end portion of the fan-out line SL and the fan-out line SL may be disposed on the interlayer insulating layer 135 of the non-display area NDA.

The fan-out line SL may be formed of the same first metal layer as the gate electrode 130, or may be formed of the same second metal layer as the source and drain electrodes 140 and 150.

The pad electrode 160 may be formed of the same second metal layer as the source and drain electrodes 140 and 150. The pad electrode 160 may include the first layer 161, the second layer 162, and the third layer 163 which are sequentially stacked. The second layer 162 of the pad electrode 160 may serve as a main conductive layer. The first layer 161 and the third layer 163 of the pad electrode 160 may serve as an auxiliary conductive layer for protecting the lower and upper surfaces of the second layer 162, respectively. The pad electrode 160 may include aluminum (Al). The first layer 161 and the third layer 163 of the pad electrode 160 may include titanium (Ti), and the second layer 162 of the pad electrode 160 may include aluminum (Al).

When the fan-out line SL is formed of the first metal layer, the pad electrode 160 may contact the fan-out line SL through a contact hole formed in the interlayer insulating layer 135. Alternatively, when the fan-out line SL is formed of the second metal layer, the pad electrode 160 may be formed integrally with the fan-out line SL.

In an exemplary embodiment, the pixel electrode 180 of the organic light emitting diode OLED may be patterned by a two-step etch process. For example, the third electrode 183 disposed on top of the pixel electrode 180 is patterned first by a first etching process using a first etchant. Then, the second electrode 182 and the first electrode 181 disposed under the third electrode 183 may be simultaneously patterned by the second etching process using a second etchant. That is, the third electrode 183 disposed on top of the pixel electrode 180 may be patterned by a first etching process using a first etchant at a first point in time, and then, the second electrode 182 and the first electrode 181 disposed under the third electrode 183 may be simultaneously patterned by the second etching process using a second etchant at a second point in time occurring after the first point in time.

In an exemplary embodiment, the pixel electrode 180 including silver (Ag) is patterned by the two-step etching process. Therefore, the number of silver particles generated by silver ions (Ag+) generated in the etching process may be reduced. In addition, as a result of performing the patterning using the two-step etching process, corrosion of the side surface of the pad electrode 160 in which the silver ions (Ag+) are generated by galvanic reaction with aluminum (Al) contained in the pad electrode 160 may be reduced. The presence of silver particles may cause various defects in subsequent processes. For example, the silver particles may combine with moisture in subsequent processes and gradually proliferate. Therefore, the silver particles may cause a defect that shorts the pixel electrode 180 and the opposing electrode 230. In addition, shorting between adjacent pad electrodes 160 may occur.

Thus, according to an exemplary embodiment, the pixel electrode 180 is formed by the two-step etching process described herein. As a result of using the two-step etching process according to exemplary embodiments, generation of silver particles may be suppressed, and thus, defects that may occur during the manufacturing process may be reduced.

FIGS. 4 to 10 are cross-sectional views illustrating a method of manufacturing a display device according to an exemplary embodiment.

Figure 4:
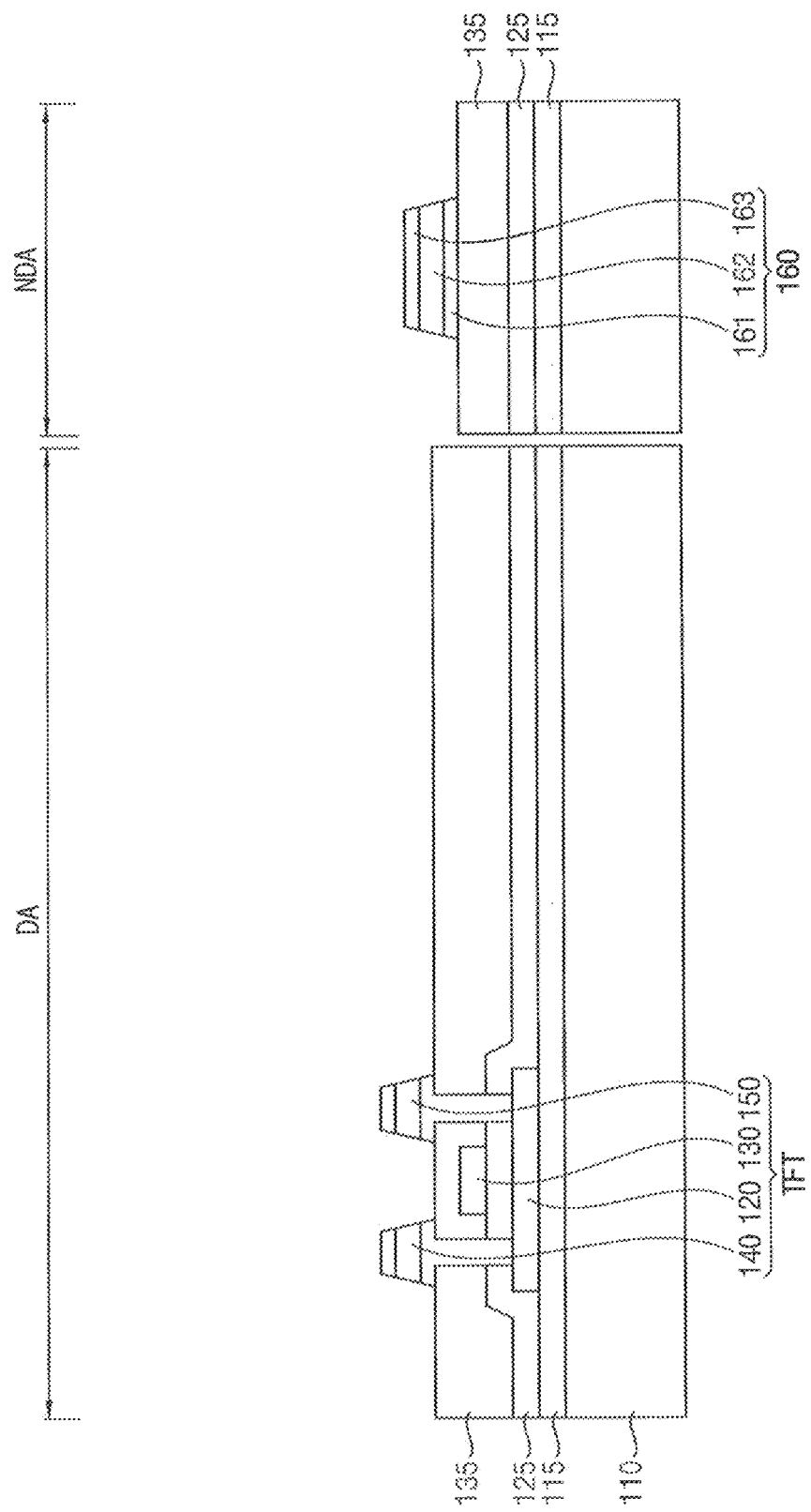
FIGS. 4 to 10 are cross-sectional views illustrating a method of manufacturing a display device according to an exemplary embodiment.

Referring to FIG. 4, a thin film transistor TFT may be formed in the display area DA of the substrate 110, and a pad electrode 160 may be formed in the non-display area NDA of the substrate 110.

The buffer layer 115 may be formed in the display area DA and the non-display area NDA of the substrate 110. The buffer layer 115 may be formed by various methods such as, for example, chemical vapor deposition, sputtering, etc. using silicon oxide, silicon nitride, silicon oxynitride, or the like.

The semiconductor layer 120 may be formed in the display area DA of the substrate 110 on which the buffer layer 115 is formed. For example, the semiconductor layer 120 may be formed on the buffer layer 115 in the display area DA of the substrate 110. For example, a semiconductor layer 120 may be formed by forming a layer including a silicon-containing material and an oxide semiconductor on the entire surface of the buffer layer 115, and patterning the layer. When the semiconductor layer 120 is made of a material including the silicon, an amorphous silicon layer may be formed on an entire surface of the buffer layer 115 and crystallized to form a polycrystalline silicon layer. Thereafter, the polycrystalline silicon layer is patterned and impurity is doped on both sides of the patterned polycrystalline silicon layer. Thus, a semiconductor layer 120 including a source area, a drain area and a channel area therebetween may be formed.

The gate insulating layer 125 may be formed in the display area DA and the non-display area NDA of the substrate 110 on which the semiconductor layer 120 is formed. For example, the gate insulating layer 125 may be formed on the semiconductor layer 120 and on the buffer layer 115 in the display area DA of the substrate 110, and may be formed on the buffer layer 115 in the non-display area NDA of the substrate 110. The gate insulating layer 125 may be formed using, for example, silicon oxide, silicon nitride, silicon oxynitride, or the like.

The first metal layer may be formed on the gate insulating layer 125, and the first metal layer may be patterned to form the gate electrode 130 in the display area DA. The gate electrode 130 may overlap the semiconductor layer 120. The first metal layer may be formed using, for example, a metal, an alloy of a metal, or the like.

The interlayer insulating layer 135 may be formed in the display area DA of the substrate 110 on which the gate electrode 130 is formed. For example, the interlayer insulating layer 135 may be formed on the gate insulating layer 125 and on the gate electrode 130 in the display area DA of the substrate 110, and on the gate insulating layer 125 in the non-display area NDA of the substrate 110. The interlayer insulating layer 135 may be formed using, for example, silicon oxide, silicon nitride, silicon oxynitride, or the like.

The interlayer insulating layer 135 and the gate insulating layer 125 may form a plurality of contact holes exposing the semiconductor layer 120. For example, the contact holes may expose the source area and the drain area of the semiconductor layer 120, respectively.

A second metal layer is formed on the substrate 110 on which the interlayer insulating layer 135 is formed, and the second metal layer is patterned. The second metal layer may be patterned to form the source electrode 140 and the drain electrode 150 in the display area DA and the pad electrode 160 in the non-display area NDA.

The second metal layer may include, for example, aluminum (Al) and an aluminum alloy, and the aluminum alloy may include, for example, any one of copper (Cu), vanadium (V) and silicon (Si).

In an exemplary embodiment, the second metal layer may include a first layer 161, a second layer 162, and a third layer 163 that are sequentially stacked. For example, the second metal layer, in which a first layer including titanium (Ti), a second layer including aluminum (Al), and a third layer including titanium (Ti) are sequentially stacked, may be formed on the interlayer insulating layer 135. Accordingly, the source electrode 140, the drain electrode 150, and the pad electrode 160 may have a stacked structure of Ti/Al/Ti.

Figure 5:
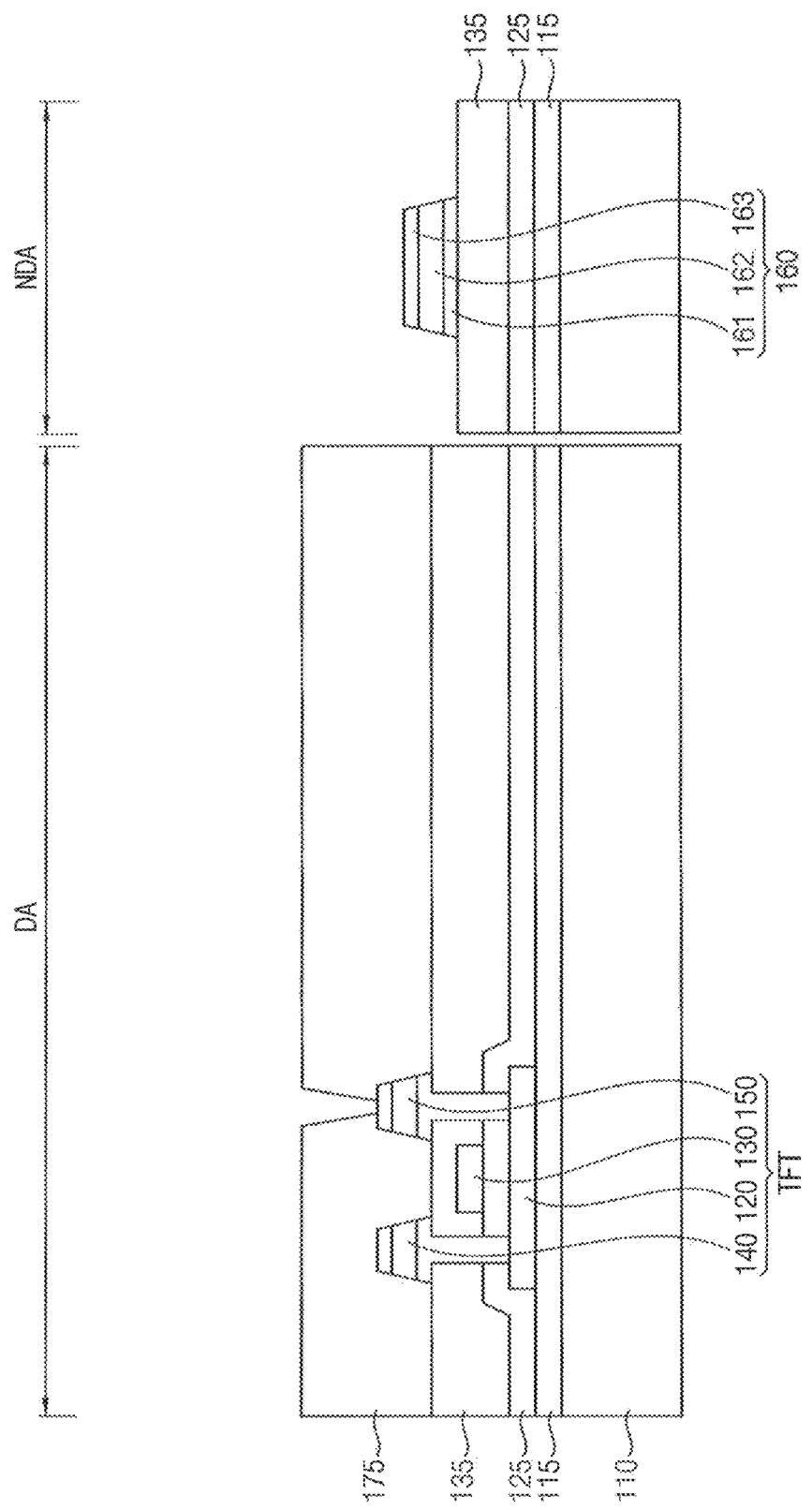

Referring to FIG. 5, a planarization layer 175 is formed on the substrate 110 on which the interlayer insulating layer 135 is formed. For example, the planarization layer 175 is formed on the interlayer insulating layer 135 and on parts of the TFT in the display area DA of the substrate 110. The planarization layer 175 may include organic materials such as, for example, an acrylic resin, an epoxy resin, a polyimide resin, and a polyester resin. The planarization layer 175 may be formed to have a thickness that is sufficient to cover the source electrode 140 and the drain electrode 150 formed in the display area DA.

The planarization layer 175 may be patterned to remain in the display area DA and removed to expose the pad electrode 160 in the non-display area NDA.

Figure 6:
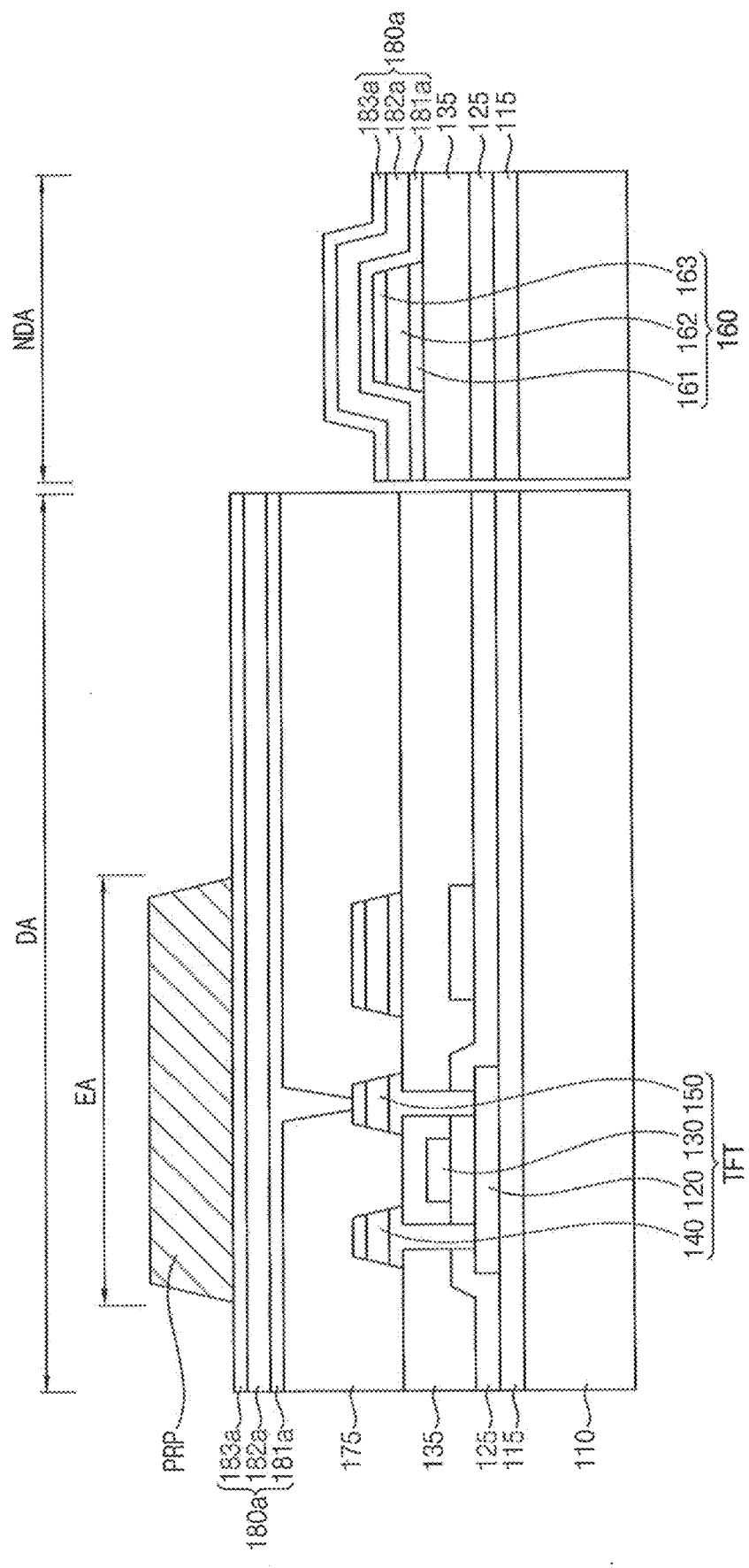

Referring to FIG. 6, a pixel electrode layer 180a is formed on the substrate 110 on which the planarization layer 175 is formed. For example, the pixel electrode layer 180a is formed on the planarization layer 175 in the display area DA of the substrate 110. In addition, as shown in FIG. 6, the pixel electrode layer 180a is formed on the pad electrode 160 in the non-display area NDA. The pixel electrode layer 180a includes a first conductive layer 181a, a second conductive layer 182a, and a third conductive layer 183a which are sequentially stacked.

The first conductive layer 181a may include indium tin oxide (ITO). The second conductive layer 182a may include silver (Ag). The third conductive layer 183a may include indium tin oxide (ITO). Thus, the pixel electrode layer 180a may have a stacked structure of ITO/Ag/ITO.

A photoresist pattern PRP is formed in the display area DA on the substrate 110 on which the pixel electrode layer 180a is formed. For example, the photoresist pattern PRP is formed on the pixel electrode layer 180a in the display area DA of the substrate 110. The photoresist pattern PRP may be formed in an electrode area EA in which the pixel electrode 180 of the organic light emitting diode OLED in the display area DA is formed.

Figure 7:
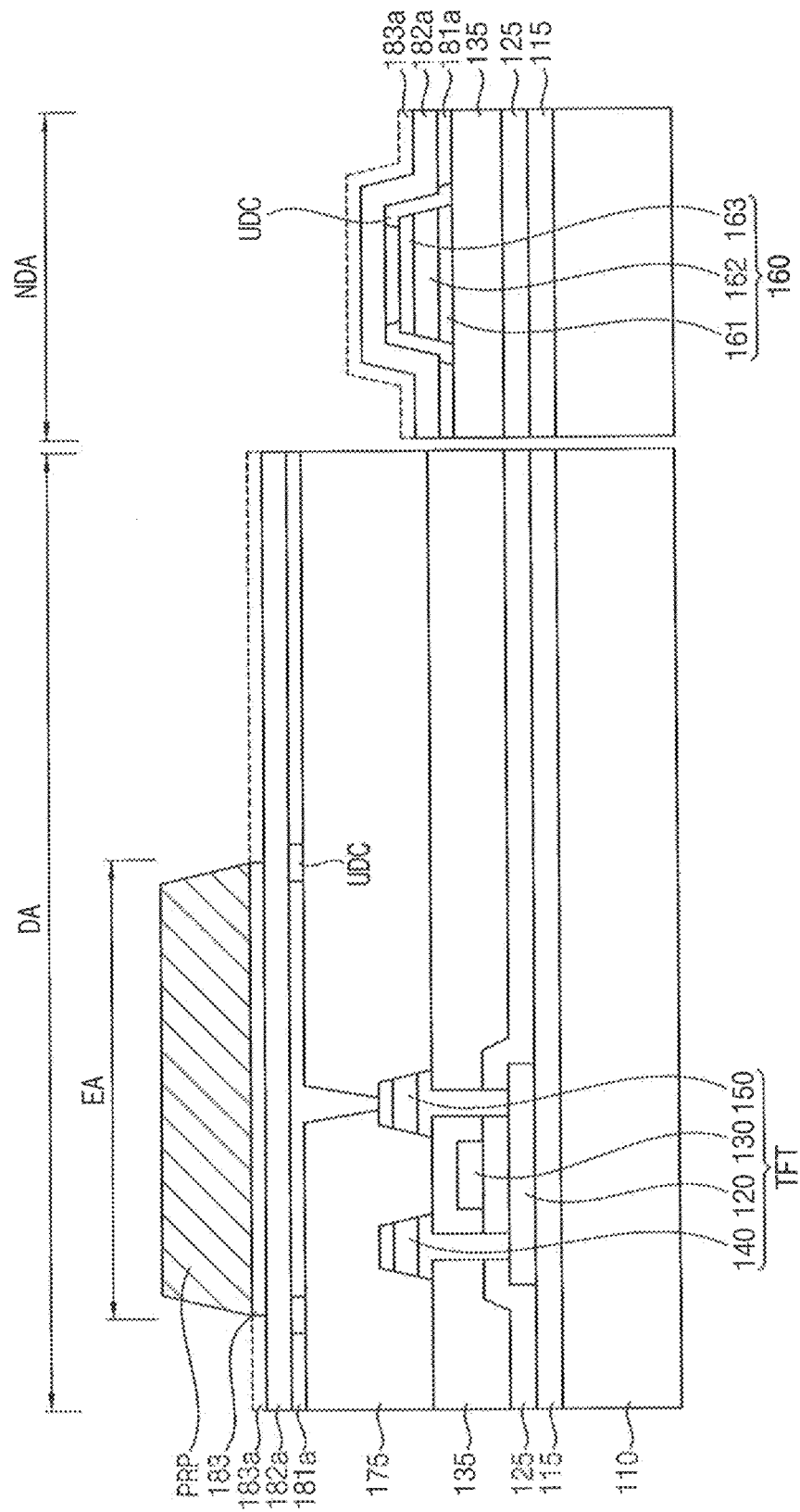

Referring to FIG. 7, the third conductive layer 183a disposed above the pixel electrode layer 180a is etched through a first etching process using the photoresist pattern PRP as a mask. The first etchant used in the first etching process may include, for example, a composition for etching the indium tin oxide (ITO).

The third conductive layer 183a formed in the display area DA by the first etching process is patterned by a third electrode 183 of the pixel electrode 180. In addition, the third conductive layer 183a formed in the non-display area NDA is removed.

In the first etching process, the first etchant penetrates to the second conductive layer 182a and the first conductive layer 181a disposed under the third conductive layer 183a. The first conductive layer 181a including the indium tin oxide (ITO), which is the same material as the third conductive layer 183a, is partially removed by the first etching process to form an undercut UDC in the first conductive layer 181a.

Figure 8:
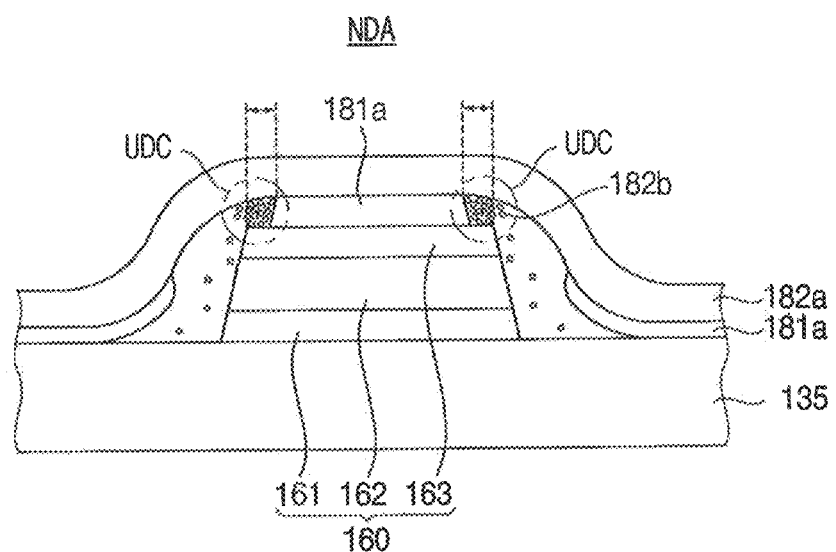

Referring to FIG. 8, the pad electrode 160 is formed to have a thickness of about 6000 Å, and the pixel electrode layer 180a is formed to have a relatively thin thickness of about 1000 Å. Accordingly, a step coverage of the pixel electrode layer 180a in a step portion of the pad electrode 160 is poor. The undercut UDC is formed at the step edge portion of the pad electrode 160 by the first etching process. The length of the undercut UDC at the step edge portion of the pad electrode 160 may be about 180 nm to about 200 nm. The length of the second conductive layer 182a at the step edge portion of the pad electrode 160 by the undercut UDC may be longer than the length of the first conductive layer 181a.

As shown in FIGS. 7 and 8, etching the third conductive layer 183a using the first etching process results in forming the undercut UDC in the first conductive layer 181a in an area corresponding to the edge portion of the pixel electrode 180 and in an area corresponding to the edge portion of the pad electrode 160. Further, etching the third conductive layer 183a results in the length of the first conductive layer 181a in the edge portion of the pixel electrode 180 and in the edge portion of the pad electrode 160 being smaller than the length of the second conductive layer 182a.

Figure 9:
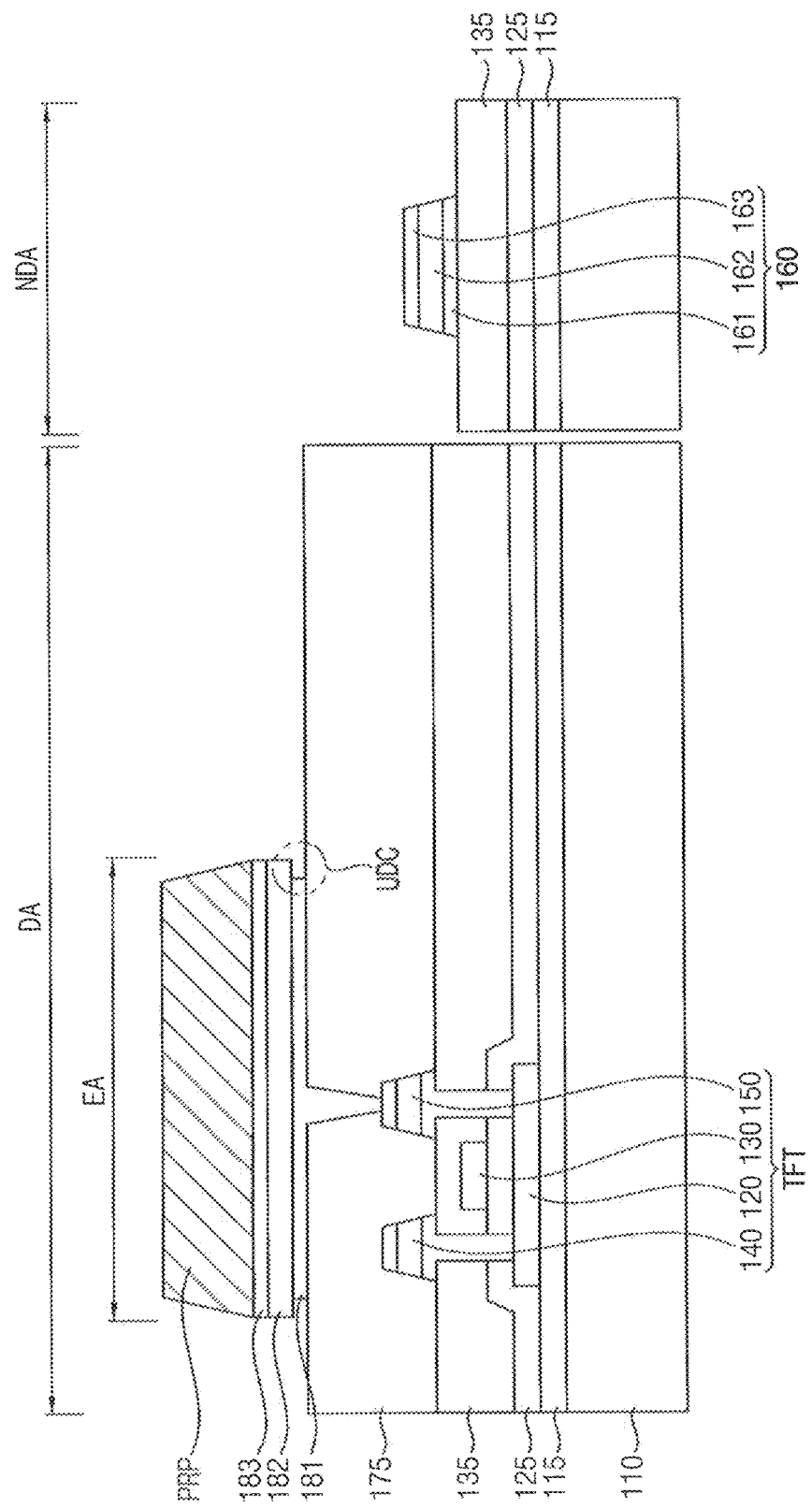

Referring to FIGS. 8 and 9, the second conductive layer 182a and the first conductive layer 181a of the pixel electrode layer 180a are etched through a second etching process using a second etchant. The second etchant may include a composition for etching the silver (Ag) and the indium tin oxide (ITO).

In the second etching process, silver (Ag) included in the second conductive layer 182a is oxidized to generate silver ions (Ag+) 182b. The silver ions (Ag+) 182b are collected in the undercut UDC formed at the stepped portion of the pad electrode 160. Since the silver ions (Ag+) 182b are gathered in the undercut UDC, the silver ions 182b may be prevented from moving toward the pad electrode 160, or the amount of silver ions 182b that move toward the pad electrode 160 may be reduced.

Accordingly, the undercut UDC inhibits migration of the silver ions (Ag+) 182b. In the second etching process, electrons (−) generated from aluminum (Al) included in the pad electrode 160 may block the binding of the silver ions (Ag+) 182b. The electrons (−) generated from the aluminum (Al) included in the pad electrode 160 may be prevented from being combined with the silver ions (Ag+) 182b. That is, generation of silver particles may be prevented or reduced.

However, some of the silver ions (Ag+) 182b may still move toward the pad electrode, and these silver ions (Ag+) 182b are reduced by the electrons (−) taken from the aluminum (Al) included in the pad electrode 160. Thus, silver particles may be generated. However, hydrogen ions included in the second etchant again take electrons (−) from the silver particles. As a result, the silver particles that have lost electrons (−) may be oxidized again to the silver ions (Ag+) 182b. Thus, the silver particles may be prevented from being generated.

As described above, according to exemplary embodiments, the number of silver particles generated in the process of forming the pixel electrode 180 may be reduced by forming the pixel electrode 180 using the two-step etching process of the pixel electrode layer 180a described above. In addition, the silver ions (Ag+) may prevent the side surface of the pad electrode 160 from corroding by blocking the reaction with aluminum (Al) included in the pad electrode 160. That is, the side surface of the pad electrode 160 may be prevented from becoming corroded by blocking the reaction with aluminum (Al) included in the pad electrode 160.

The second conductive layer 182a and the first conductive layer 181a formed in the display area DA are patterned to the second electrode 182 and the first electrode 181 of the pixel electrode 180 by the second etching process. Accordingly, the pixel electrode 180 of the organic light emitting diode OLED is formed in the electrode area EA. The edge portion of the pixel electrode 180 includes an undercut UDC formed in the first conductive layer 181a in the first etching process. The length of the undercut UDC formed in the first electrode 181 of the pixel electrode 180 may be about 190 nm to about 250 nm. That is, the first electrode 181 and the second electrode 182 of the pixel electrode 180 may have a length difference in an edge portion of the pixel electrode 180 of about 190 nm to about 250 nm corresponding to the length of the undercut UDC. For example, a length difference from an edge portion of the first electrode 181 and an edge portion of the second electrode 182 may be between about 190 nm and about 250 nm.

In addition, the second conductive layer 182a and the first conductive layer 181a formed in the non-display area NDA are removed, and the pad electrode 160 is exposed.

After the second etching process is completed, the photoresist pattern PRP is removed. In addition, the silver particles remaining on the interlayer insulating layer 135, the pad electrode 170 and the planarization layer 175 may be removed through a cleaning process.

Figure 10:
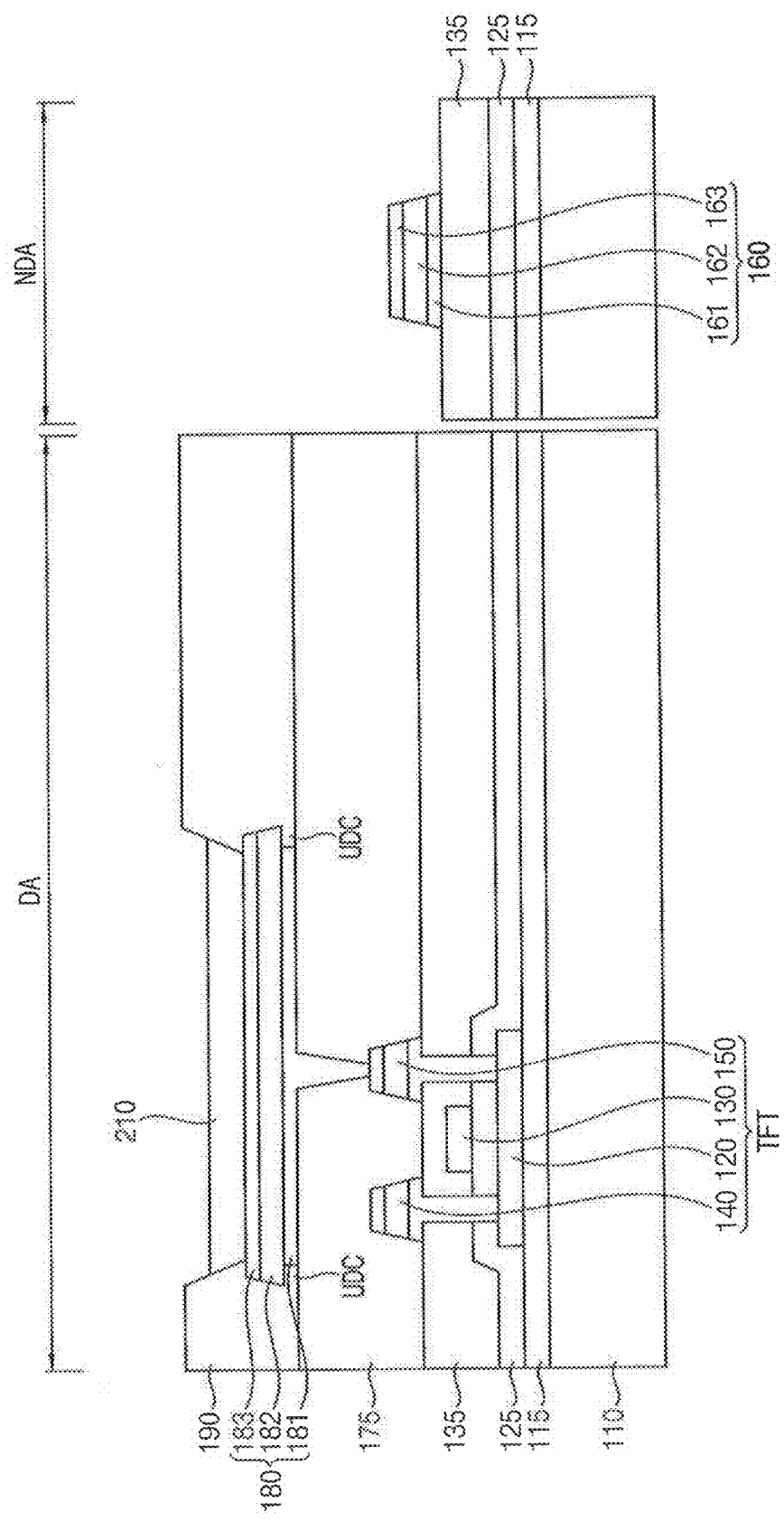

Referring to FIGS. 3 and 10, a pixel defining layer 190 covering the pixel electrode 180 may be formed on the planarization layer 175 in the display area DA. The pixel defining layer 190 may be formed of, for example, a polyimide resin, a photoresist, an acrylic resin, a polyamide resin, a siloxane resin, or the like.

The pixel defining layer 190 may be patterned to form an opening exposing the top surface of the pixel electrode 180. The pixel defining layer 190 is formed to overlap the undercut UDC formed at the edge portion of the pixel electrode 180. Thus, the pixel defining layer 190 may prevent a display defect due to the undercut UDC of the pixel electrode.

The organic light emitting layer 210 may be formed in the opening that exposes the pixel electrode 180. The organic light emitting layer 210 may be formed of, for example, a low-molecular organic compound or a high-molecular organic compound using a method such as screen printing, inkjet printing, or vapor deposition.

Thereafter, an opposing electrode 220 may be formed on the pixel defining layer 190 and the organic light emitting layer 210.

The opposing electrode 220 may be formed of, for example, lithium (Li), calcium (Ca), lithium fluoride (LiF), aluminum (Al), silver (Ag), magnesium (Mg), or the like. For example, the opposing electrode 220 may have a Mg/Ag structure in which a first layer including magnesium (Mg) and a second layer including silver (Ag) are stacked.

Figure 11A:
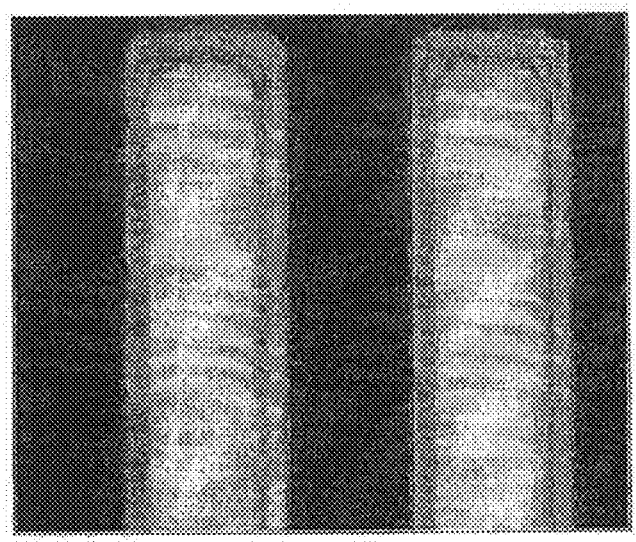
FIGS. 11A and 11B are photographs comparing the amount of silver particles generated in a method of manufacturing a display device according to an exemplary embodiment and a method of manufacturing a display device according to a comparative example.
Figure 11B:
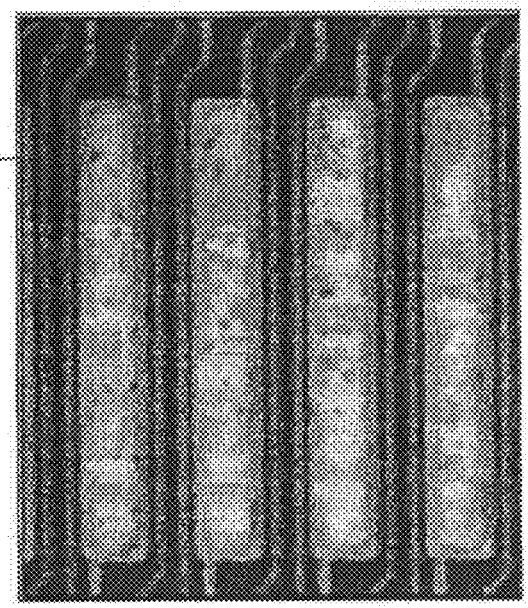
Figure 12A:
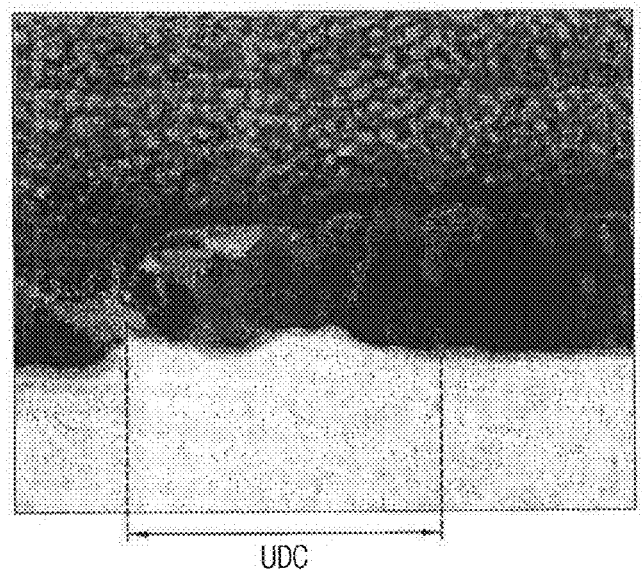
FIGS. 12A and 12B are photographs comparing an undercut according to an exemplary embodiment and a comparative example.
Figure 12B:
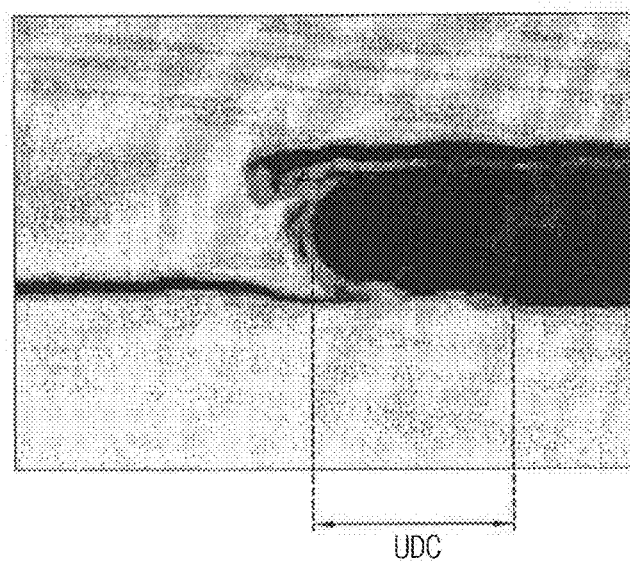

FIGS. 11A and 11B are photographs comparing the amount of silver particles generated in a method of manufacturing a display device according to an exemplary embodiment and a method of manufacturing a display device according to a comparative example. FIGS. 12A and 12B are photographs comparing an undercut according to an exemplary embodiment and a comparative example.

According to an exemplary embodiment, the etching process of the pixel electrode layer having an ITO/Ag/ITO stacked structure includes a first etching step for first etching an upper ITO layer, and a second etching step for simultaneously etching the Ag layer and a lower ITO layer after the first etching step, as described above. Results of the exemplary embodiment are illustrated in FIGS. 11A and 12A and are referred to below in Tables 1 and 2.

According to a comparative example 1, the etching process of the pixel electrode layer having the ITO/Ag/ITO stacked structure simultaneously etches the upper ITO layer, the Ag layer and the lower ITO layer. That is, in the comparative example 1, a single etching process is performed in which the upper ITO layer, the Ag layer and the lower ITO layer are all simultaneously etched. Results of the comparative example 1 are illustrated in FIGS. 11B and 12B and are referred to below in Tables 1 and 2.

According to a comparative example 2, the etching process of the pixel electrode layer having the ITO/Ag/ITO stacked structure includes a first etching step for simultaneously etching the upper ITO and the Ag layer and a second etching step for etching the lower ITO layer. Results of the comparative example 2 are illustrated below in Tables 1 and 2.

Table 1 compares the occurrence of the silver particles according to the exemplary embodiment and the two comparative examples.

TABLE 1

| | Pad | Etch Step | Ag P/C | Undercut |
| --- | --- | --- | --- | --- |
| Exemplary Embodiment | Ti/Al/Ti | (ITO->Ag/ITO) | Not occurring | Occur |
| Comparative Example 1 | | (ITO/Ag/ITO) | Occur | Not occurring |
| Comparative Example 2 | | (ITO/Ag->ITO) | Occur | Not occurring |

Referring to FIG. 11A and Table 1, in the exemplary embodiment, the silver particle Ag P/C hardly occurs on the pad electrode 160.

Referring to FIG. 11B and Table 1, in the comparative example 1, a large number of the silver particle Ag P/C was formed on the pad electrode. In addition, in the comparative example 2, a large number of the silver particle Ag P/C was generated on the pad electrode.

Referring to a relationship between the silver particle Ag P/C and the undercut of the pad electrode 160, the undercut is formed in the conductive layer of the pad electrode 160 in the case of the exemplary embodiment in which the silver particle Ag P/C does not occur (or barely occurs). However, the undercut was not formed in the conductive layer of the pad electrode in the case of the comparative examples 1 and 2 in which the silver particle Ag P/C was generated in a large number.

Therefore, as can be seen, when the undercut is formed in the conductive layer of the pad electrode 160, as is done in exemplary embodiments, the silver particle Ag P/C is not generated (or is barely generated).

Table 2 compares the undercuts according to the exemplary embodiment and the two comparative examples.

TABLE 2

|  | Pad | Etch Step | Undercut (Pad Area) |
|---|---|---|---|
| Exemplary Embodiment | Ti/Al/Ti | (ITO->Ag/ITO) | 196.7 nm |
| Comparative Example 1 |  | (ITO/Ag/ITO) | 106.5 nm |
| Comparative Example 2 |  | (ITO/Ag->ITO) | 181.0 nm |

Referring to FIG. 12A and Table 2, in the case of the exemplary embodiment, a length of the undercut UDC formed in the conductive layer of the pad electrode 160 was about 196.7 nm. In the case of the comparative example 1, a length of the undercut formed in the conductive layer of the pad electrode was about 106.5 nm. In the case of the comparative example 2, a length of the undercut formed in the conductive layer of the pad electrode was about 181.0 nm.

Referring to FIGS. 12A and 12B, the length of the undercut UDC according to the exemplary embodiment is about twice that of the undercut UDC according to the comparative example 1.

Thus, as can be seen, the length of the undercut of the pad electrode formed by the two-step etching process of the pixel electrode layer according to the exemplary embodiment is about two times more than the undercut of the pad electrode formed by the simultaneous etching process of the pixel electrode layer according to the comparative example 1. Thus, as can be seen, referring to the exemplary embodiment, when the length of the undercut formed in the conductive layer of the pixel electrode increases, the number of the silver particles decreases.

As a result, when the undercut is formed in the conductive layer of the pad electrode, the silver particles may be substantially reduced.

According to exemplary embodiments of the inventive concept, the pixel electrode layer having a stacked structure of ITO/Ag/ITO is patterned by first patterning the upper ITO layer with a first etching process, and then subsequently simultaneously patterning the Ag layer and the lower ITO layer with a second etching process. The number of silver particles may be reduced through this two-step etching process. Therefore, defects that may occur as a result of the generation of a large amount of silver particles in the manufacturing process may be removed or reduced. In addition, according to exemplary embodiments, the side surface of the pad electrode may be prevented from being corroded by blocking the reaction with aluminum (Al) included in the pad electrode.

Exemplary embodiments of the present inventive concept may be applied to a display device and an electronic device having the display device. For example, exemplary embodiments of the present inventive concept may be applied to a computer monitor, a laptop, a digital camera, a cellular phone, a smartphone, a smart pad, a television, a personal digital assistant (PDA), a portable multimedia player (PMP), an MP3 player, a navigation system, a game console, a video phone, etc.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A display device, comprising:
an insulating layer disposed on a substrate;
a pixel electrode comprising a first conductive layer, a second conductive layer, and a third conductive layer sequentially stacked on the insulating layer in a first direction, wherein an entirety of a length of the first conductive layer is less than an entirety of a length of the second conductive layer in a second direction crossing the first direction;
a pixel defining layer covering the pixel electrode and partially exposing the pixel electrode through an opening;
an organic light emitting layer disposed in the opening of the pixel defining layer; and
an opposing electrode disposed on the organic light emitting layer and overlapping the pixel electrode.

2. The display device of claim 1, wherein the first conductive layer comprises indium tin oxide (ITO), the second conductive layer comprises silver (Ag), and the third conductive layer comprises indium tin oxide (ITO).

3. The display device of claim 1, further comprising:
a pad electrode disposed on the substrate in a non-display area that surrounds a display area,
wherein the pad electrode comprises aluminum (Al).

4. The display device of claim 3, wherein the pad electrode comprises a first layer, a second layer and a third layer which are sequentially stacked,
wherein the first layer and the third layer comprise titanium (Ti) and the second layer comprises aluminum (Al).

5. The display device of claim 1, further comprising:
a thin film transistor disposed between the substrate and the pixel electrode,
wherein the thin film transistor comprises a semiconductor layer, a gate electrode, a source electrode, and a drain electrode.

6. The display device of claim 1, wherein a length difference between the first conductive layer and the second conductive layer in an edge portion of the pixel electrode is about 190 nm to about 250 nm.

7. A method of manufacturing a display device, comprising:
forming an insulating layer in a display area of a substrate;
forming a pixel electrode comprising a first conductive layer, a second conductive layer, and a third conductive layer sequentially stacked on the insulating layer,
wherein the first conductive layer comprises indium tin oxide (ITO), the second conductive layer comprises silver (Ag) and the third conductive layer comprises indium tin oxide (ITO);
patterning the third conductive layer of the pixel electrode by etching the third conductive layer with a first etchant;

patterning the second conductive layer and the first conductive layer of the pixel electrode by etching the second conductive layer and the first conductive layer with a second etchant;

forming an organic light emitting layer on the pixel electrode; and forming an opposing electrode overlapping the pixel electrode on the organic light emitting layer.

8. The method of claim 7, further comprising:

forming a pad electrode in a non-display area of the substrate, wherein the non-display area surrounds the display area, the pad electrode comprises aluminum (Al).

9. The method of claim 8, wherein the pad electrode comprises a first layer, a second layer and a third layer which are sequentially stacked, the first layer and the third layer comprise titanium (Ti), and the second layer comprises aluminum (Al).

10. The method of claim 8, wherein forming the pixel electrode comprises:

forming the pixel electrode on the pad electrode disposed in the non-display area.

11. The method of claim 7, wherein in the etching of the third conductive layer, a length of the first conductive layer in an edge portion of the pixel electrode and in an edge portion of the pad electrode is smaller than a length of the second conductive layer, respectively.

12. The method of claim 8, wherein in the etching of the third conductive layer, an undercut is formed in the first conductive layer in an area corresponding to an edge portion of the pixel electrode and in an area corresponding to an edge portion of the pad electrode.

13. The method of claim 12, wherein in the etching of the second conductive layer and the first conductive layer, a silver ion generated from the second conductive layer is collected in the undercut.

14. The method of claim 12, wherein a length of the undercut formed in the edge portion of the pixel electrode is about 190 nm to about 250 nm.

15. The method of claim 12, wherein a length of the undercut formed in the edge portion of the pad electrode is about 180 nm to about 200 nm.

16. The method of claim 12, further comprising:

forming a pixel defining layer, wherein the pixel defining layer covers the undercut of the pixel electrode and has an opening partially exposing the pixel electrode; and forming the organic light emitting layer in the opening of the pixel defining layer.

17. The method of claim 7, further comprising:

forming a thin film transistor between the substrate and the pixel electrode, wherein the thin film transistor comprises a semiconductor layer, a gate electrode, a source electrode, and a drain electrode.

18. A display device, comprising:

an insulating layer disposed in a display area of a substrate;

a pixel electrode comprising a first conductive layer, a second conductive layer, and a third conductive layer sequentially stacked on the insulating layer, wherein an undercut is formed in an edge portion of the first conductive layer;

a pixel defining layer covering the undercut of the pixel electrode and having an opening partially exposing the pixel electrode;

an organic light emitting layer disposed in the opening of the pixel defining layer; and an opposing electrode disposed on the organic light emitting layer and overlapping the pixel electrode.

19. The display device of claim 18, wherein the first conductive layer comprises indium tin oxide (ITO), the second conductive layer comprises silver (Ag), and the third conductive layer comprises indium tin oxide (ITO).

20. A method of manufacturing a display device, comprising:

forming an insulating layer in a display area of a substrate;

forming a pixel electrode comprising a first conductive layer, a second conductive layer, and a third conductive layer sequentially stacked on the insulating layer;

patterning the third conductive layer of the pixel electrode by etching the third conductive layer with a first etchant;

patterning the second conductive layer and the first conductive layer of the pixel electrode by etching the second conductive layer and the first conductive layer with a second etchant;

forming an organic light emitting layer on the pixel electrode; and forming an opposing electrode overlapping the pixel electrode on the organic light emitting layer, wherein in the etching of the third conductive layer, an undercut is formed in the first conductive layer in an area corresponding to an edge portion of the pixel electrode.

* * * * *